United States Patent
Khalil et al.

(10) Patent No.: US 9,000,484 B2
(45) Date of Patent: Apr. 7, 2015

(54) NON-UNIFORM LATERAL PROFILE OF TWO-DIMENSIONAL ELECTRON GAS CHARGE DENSITY IN TYPE III NITRIDE HEMT DEVICES USING ION IMPLANTATION THROUGH GRAY SCALE MASK

(75) Inventors: Sameh G. Khalil, Calabasas, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 45 days.

(21) Appl. No.: 13/478,402

(22) Filed: May 23, 2012

(65) Prior Publication Data

US 2013/0313611 A1    Nov. 28, 2013

(51) Int. Cl.
| | | |
|---|---|---|
| *H01L 29/66* | (2006.01) |
| *H01L 21/265* | (2006.01) |
| *H01L 29/34* | (2006.01) |
| *H01L 29/778* | (2006.01) |
| *H01L 29/20* | (2006.01) |
| *H01L 29/423* | (2006.01) |

(52) U.S. Cl.
CPC .... *H01L 29/66431* (2013.01); *H01L 21/26546* (2013.01); *H01L 29/2003* (2013.01); *H01L 29/34* (2013.01); *H01L 29/4236* (2013.01); *H01L 29/66462* (2013.01); *H01L 29/7786* (2013.01)

(58) Field of Classification Search
USPC .......................................... 257/194, E29.246
See application file for complete search history.

(56) References Cited

U.S. PATENT DOCUMENTS

| | | | |
|---|---|---|---|
| 4,635,083 A | 1/1987 | Cooper, Jr. | |
| 4,663,643 A | 5/1987 | Mimura | |
| 4,800,172 A | 1/1989 | Okano | |
| 5,254,863 A | 10/1993 | Battersby | |
| 5,309,007 A | 5/1994 | Kelner | |
| 7,038,299 B2 | 5/2006 | Furukawa | |
| 7,083,253 B2 | 8/2006 | Kimura | |
| 7,859,014 B2 * | 12/2010 | Nakayama et al. | 257/192 |
| 8,076,685 B2 * | 12/2011 | Tamura et al. | 257/97 |
| 8,124,505 B1 | 2/2012 | Burnham | |
| 8,159,004 B2 | 4/2012 | Sato | |
| 8,680,536 B2 * | 3/2014 | Khalil et al. | 257/76 |
| 2005/0023555 A1 * | 2/2005 | Yoshida et al. | 257/192 |
| 2006/0220065 A1 | 10/2006 | Kawasaki | |
| 2007/0158692 A1 * | 7/2007 | Nakayama et al. | 257/213 |
| 2008/0157121 A1 | 7/2008 | Ohki | |
| 2009/0008677 A1 | 1/2009 | Kikkawa | |

(Continued)

FOREIGN PATENT DOCUMENTS

| | | |
|---|---|---|
| KR | 10-2011-0026798 A | 3/2011 |
| KR | 10-2011-0136719 A | 12/2011 |

OTHER PUBLICATIONS

H. Xing, "High Breakdown Voltage AlGaN/GaN HEMTs Achieved by Multiple Field Plates", IEEE Electron Device Letters, vol. 25, No. 4, Apr. 2004.

(Continued)

*Primary Examiner* — Bilkis Jahan
(74) *Attorney, Agent, or Firm* — Ladas & Parry

(57) ABSTRACT

A high electron mobility field effect transistor (HEMT) includes a two dimensional electron gas (2DEG) in the drift region between the gate and the drain that has a non-uniform lateral 2DEG distribution that increases in a direction in the drift region from the gate to the drain.

14 Claims, 4 Drawing Sheets

(56) References Cited

U.S. PATENT DOCUMENTS

| | | | |
|---|---|---|---|
| 2009/0072272 A1 | 3/2009 | Suh | |
| 2010/0117146 A1 | 5/2010 | Ikeda et al. | |
| 2010/0140660 A1 | 6/2010 | Wu et al. | |
| 2010/0140663 A1 | 6/2010 | Hopper | |
| 2010/0219452 A1 | 9/2010 | Brierley | |
| 2011/0018040 A1 | 1/2011 | Smith et al. | |
| 2011/0031532 A1* | 2/2011 | Kikkawa et al. | 257/194 |
| 2011/0049526 A1 | 3/2011 | Chu | |
| 2011/0057257 A1* | 3/2011 | Park et al. | 257/330 |
| 2011/0092057 A1 | 4/2011 | Suvorov | |
| 2011/0127541 A1 | 6/2011 | Wu | |
| 2011/0254012 A1 | 10/2011 | Vashchenko | |
| 2011/0263102 A1 | 10/2011 | Heikman et al. | |
| 2011/0303952 A1 | 12/2011 | Hwang | |
| 2012/0091508 A1 | 4/2012 | Aoki | |
| 2012/0098599 A1 | 4/2012 | Chang | |
| 2012/0211760 A1 | 8/2012 | Yamada | |
| 2012/0261720 A1* | 10/2012 | Puglisi et al. | 257/194 |
| 2013/0313612 A1 | 11/2013 | Khalil et al. | |
| 2014/0051221 A1 | 2/2014 | Khalil et al. | |

OTHER PUBLICATIONS

C.M. Waits, et al., "Gray-Scale Lithography for MEMS Applications", University of Maryland, Department of Electrical Computer Engineering, Institute for Advanced Computer Studies, College Park, Maryland, U.S. 2006.

W. Henke, et al. "Simulation and experimental study of gray-tone lithography for the fabrication of arbitrarily shaped surfaces" Proc. IEEE Micro Electro Mechanical Syst. MEMS 1994, Oiso, Japan, pp. 205-210.

C.M. Waits, et al. " MEMS-based Gray-Scale Lithography" International Semiconductor Device Research Symposium (ISDRS), Dec. 5-7, 2001, Washington D.C.

Smorchkova, I. P. et al., "Polarization-induced charge and electron mobility in AlGaN/GaN heterostructures grown by plasma-assisted molecular epitaxy," Journal of Applied Physics, vol. 86, Issue 8, pp. 4520-4526, Oct. 1999.

U.S. Appl. No. 13/478,609, filed May 23, 2012, Khalil.

U.S. Appl. No. 13/479,018, filed May 23, 2012, Khalil.

Song et al, "Normally Off AlGaN/GaN Low-Density Drain HEMT (LDD-HEMT) With Enhanced Breakdown Voltage and Reduced Current Collapse", IEEE Electron Device Letters, vol. 28, No. 3, Mar. 2007.

PCT International Search Report and Written Opinion mailed on Aug. 26, 2013 for related PCT Application No. PCT/US2013/040447 (9 pages).

PCT International Search Report and Written Opinion mailed on Sep. 27, 2013 for corresponding PCT Application No. PCT/US2013/040441 (11 pages).

PCT International Search Report and Written Opinion mailed on Sep. 30, 2013 for related PCT Application No. PCT/US2013/040431 (9 pages).

From U.S. Appl. No. 13/479,018, Application and Office Actions, including but not limited to the Office Actions mailed on Mar. 29, 2013 and Jul. 19, 2013.

From U.S. Appl. No. 13/478,609, Application and Office Actions.

Restriction Requirement dated May 8, 2014 for U.S. Appl. No. 13/478,609 (now published as US 2013/0313612).

Non-Final Office Action dated Jul. 8, 2014 for U.S. Appl. No. 13/478,609 (now published as US 2013/0313612).

Notice of Allowance dated Oct. 25, 2013 for U.S. Appl. No. 13/479,018 (now published as US 8,680,536).

U.S. Appl. No. 14/163,898 and Office Actions.

Chapter II PCT International Preliminary Report on Patentability mailed on May 6, 2014 from related PCT Application No. PCT/US2013/040431.

Chapter II PCT International Preliminary Report on Patentability mailed on May 23, 2014 from related PCT Application No. PCT/US2013/040441.

U.S. Appl. No. 14/163,898, filed Jan. 24, 2014, Sameh Khalil.

Notice of Allowance dated Sep. 11, 2014 for U.S. Appl. No. 14/063,207 (now published as US 2014-0051221).

Non-Final Office Action dated Aug. 25, 2014 for U.S. Appl. No. 14/163,898 (unpublished/non publication request filed Jan. 24, 2014).

* cited by examiner

| FORMING A TAPERED SECTION ON THE MASK LAYER THAT HAS A THICKNESS THAT INCREASES IN THE DIRECTION FROM THE GATE TO THE DRAIN BY USING GRAY SCALE PHOTOLITHOGRAPHY | 108 |
|---|---|
| ETCHING THE MASK LAYER TO FORM THE TAPERED SECTION | 110 |

FIG. 3B

| COATING THE CARRIER SUPPLY LAYER WITH PHOTORESIST | 112 |
|---|---|
| OPENING WINDOWS IN THE PHOTORESIST OF VARYING SIZE WHEREIN THE SIZE OF THE OPENINGS DECREASE IN THE DIRECTION FROM THE GATE TO THE DRAIN | 114 |

FIG. 3C

NON-UNIFORM LATERAL PROFILE OF TWO-DIMENSIONAL ELECTRON GAS CHARGE DENSITY IN TYPE III NITRIDE HEMT DEVICES USING ION IMPLANTATION THROUGH GRAY SCALE MASK

CROSS REFERENCE TO RELATED APPLICATIONS

This application is related to U.S. patent application Ser. No. 13/478,609 filed on the same date as this application and entitled "HEMT GaN Device with a Non-Uniform Lateral Two-Dimensional Electron Gas Profile and Process for Manufacturing the Same" and to U.S. patent application Ser. No. 13/479,018 filed on the same date as this application and entitled "Non-Uniform Two-Dimensional Electron Gas Profile in III-Nitride HEMT Devices".

TECHNICAL FIELD

This disclosure relates to type III-nitride HEMT devices and in particular to two dimensional electron gas (2DEG) in the drift region.

BACKGROUND

A high electron mobility transistor (HEMT) is a field effect transistor incorporating a junction between two materials with different band gaps (i.e., a heterojunction). Gallium nitride (GaN) HEMTs have attracted attention due to their high-power performance. In type III-nitride HEMT devices used in power applications there is a design trade-off between the on-state resistance and breakdown voltage (BV). Since the relation between the BV and on resistance is at least quadratic, improvement in the BV for a given drift region length results in a significant improvement in the FOM of the device, defined as $BV^2/Ron$.

In the prior art type III-nitride HEMT devices have a uniform 2DEG density which results in a peak electric field under or near the gate region. The electric field distribution tends to be closer to a triangular shape than to the desired trapezoidal shape which reduces the breakdown voltage per unit drift region length of the device. The use of field plate and multistep field plates are some of the techniques that are used to improve the electric field distribution. However, field plates typically result in multiple peaks and suffer from less than ideal flat field distribution, and may exhibit a saw tooth profile. Field plates also add to the gate to drain capacitance. In addition, process complexity and cost typically increase with the number of field plate steps.

U.S. Pat. No. 7,038,253 to Furukawa describes a GaN based device on silicon (Si) technology which uses a uniform 2DEG profile in the drift region. Because of the absence of any field shaping technique in the Furukawa device, the breakdown voltage and dynamic on resistance from drain to source is limited by a localized increase in the electric field under the gate region thus requiring over design of the device which degrades the figure of merit (FOM) that such a device can achieve.

In "High Breakdown Voltage AlGaN/GaN HEMTs Achieved by Multiple Field Plates" by H. Xing et. Al, a field shaping technique that uses multiple field plates is described to improve the electric field distribution. However, multiple field plates do not achieve a uniform electric field, may have a saw tooth type distribution, and introduce gate to drain capacitance. Implementing such a device structure also increases device complexity and cost.

What is needed is a significant improvement in the FOM in type III nitride HEMT devices, and in particular an improvement in the breakdown voltage for a given drift region length, so that the FOM of the device, defined as $BV^2/Ron$, improves. The embodiments of the present disclosure answer these and other needs.

SUMMARY

In a first embodiment disclosed herein, a high electron mobility field effect transistor (HEMI) comprises a two dimensional electron gas (2DEG) in the drift region between the gate and the drain that has a non-uniform lateral 2DEG distribution that increases in a direction in the drift region from the gate to the drain.

In another embodiment disclosed herein, a high electron mobility field effect transistor (HEMI) comprises lattice damage in a drift region of a carrier supply layer between a gate and a drain, wherein the lattice damage decreases in a direction in the drift region from the gate to the drain.

In yet another embodiment disclosed herein, a method of fabricating a high electron mobility field effect transistor (HEMI), the method comprises forming a channel carrier traveling layer on a substrate, forming a carrier supply layer on the channel carrier traveling layer, forming a mask layer on the carrier supply layer, the mask layer configured to be aligned with a drift region from a gate to a drain, and configured to have a lateral variation in a direction from the gate to the drain, and implanting ions through the mask layer into the carrier supply layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 3A-3C are flow diagrams for methods of fabricating a HEMT device in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
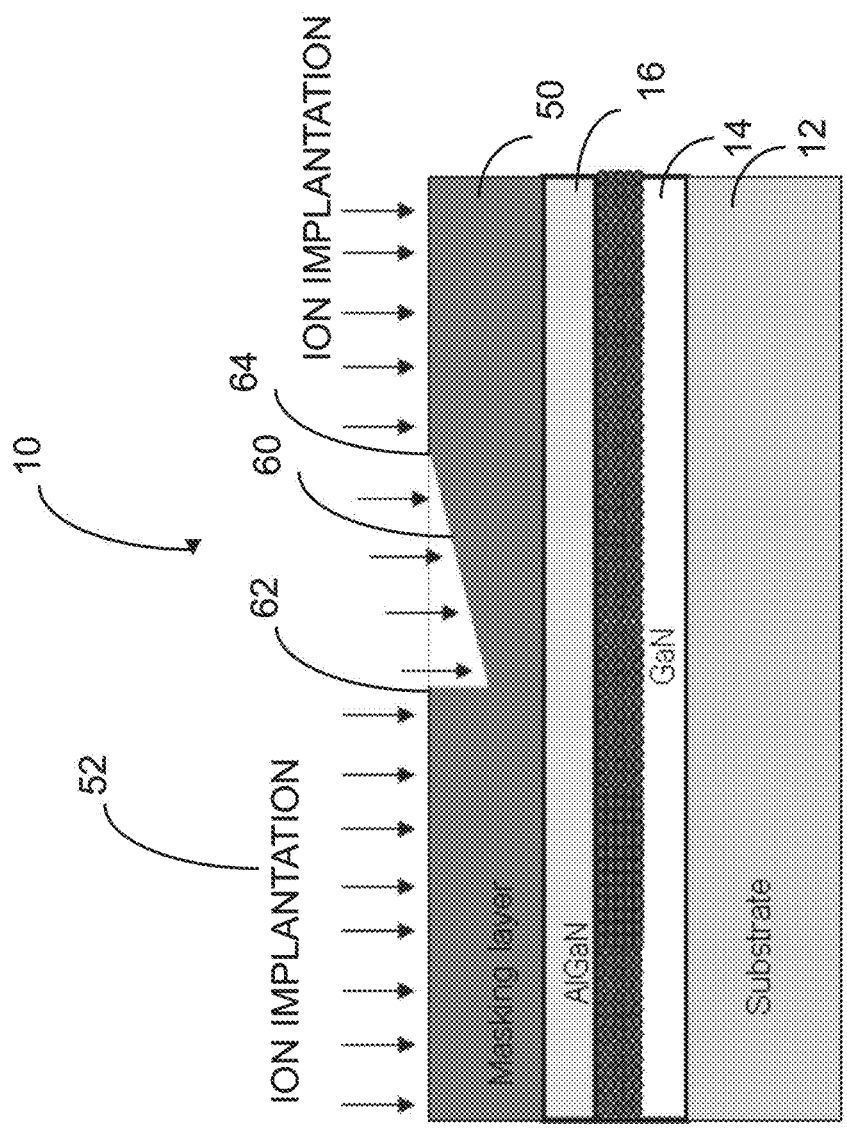
FIG. 1 shows the use of a gray scale mask to control ion implantation to be tapered in a drift region in accordance with the present disclosure.

Referring now to FIG. 1, a field effect transistor (FET) device structure 10 is shown. The FET device structure 10 is composed of a stack of III-V layers, such as GaN layer 14 and AlGaN layer 16, grown on a substrate 12 that can be any of the suitable substrates that are commonly used to grow type III-nitride materials. Suitable substrates include but are not limited to silicon (Si), Sapphire, silicon carbide (SiC), and bulk single crystal gallium nitride (GaN).

The stack of III-V layers may include a buffer layer of GaN or aluminum gallium nitride (AlGaN) grown on the substrate 12. Then a channel layer also known as a channel carrier travelling layer, such as GaN layer 14, is grown on the buffer layer. Then a barrier layer also known as a carrier supplying layer, such as AlGaN layer 16, is grown on top of the GaN layer 14. An AlN spacer layer may be between the GaN layer 14 and the AlGaN layer 16 to improve device electrical performance.

On top of the AlGaN layer 16 a suitable masking layer 50, which may be $Si_3N_4$, is grown. The masking layer 50 is used as a masking layer to stop the majority of the ions implanted via ion implantation 52 from reaching the AlGaN layer 16. Only a small fraction of the implanted ions, the tail of the Gaussian distribution, are intended to reach the AlGaN layer 16 to cause damage to the lattice. The small fraction of ions that succeed in reaching the AlGaN layer 16 ideally do not penetrate deep into the AlGaN layer 16.

Figure 2:
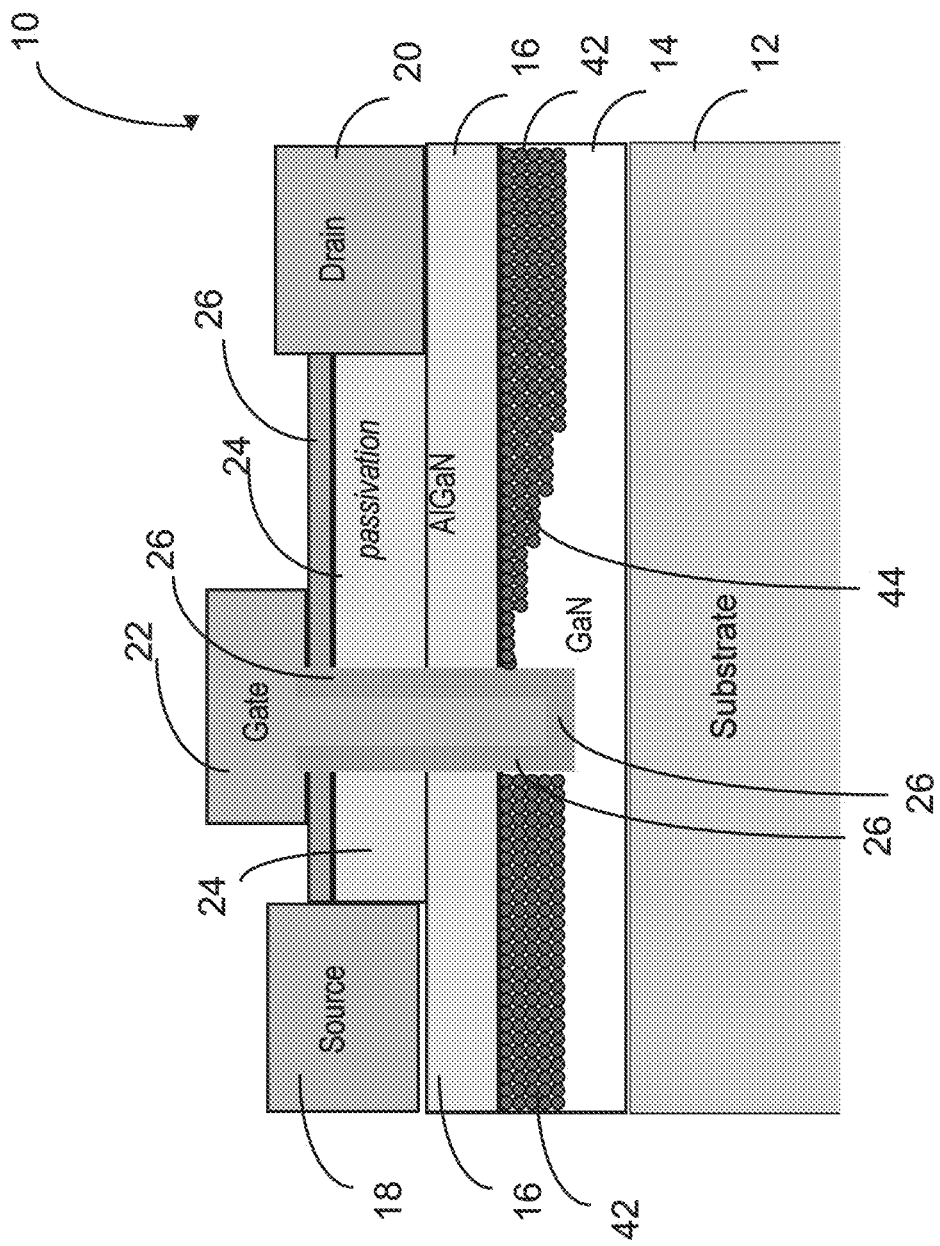
FIG. 2 shows a tapered two dimensional electron gas (2DEG) charge density in a type III Nitride device in accordance with the present disclosure.

Further, the masking layer 50 is configured to vary the density of ions implanted along the drift region between a gate and a drain of a field effect transistor (FET). A mask layer 50 may be used, as shown in FIG. 1, to form a tapered mask layer 60 in the drift region between points 62 and 64. The tapered mask layer 60 has a lateral profile and has a height that increases towards the drain. In another embodiment a mask may be used that has with various size openings to vary the density of ions implanted along the drift region. Either type of mask modulates the ion implantation between points 62 and 64, such that lattice damage due to ion implantation in the AlGaN layer 16 is greater at the point 62, near the edge of gate region 22, as shown in FIG. 2, and less at point 64 along the drift region towards the drain 20, as shown in FIG. 2. The mask layer 50 may be configured to provide a lattice damage that linearly increases from point 64, along the drift region from near the drain 20, to point 62 near the gate 22. After ion implantation the masking layer is etched and removed.

The source contact 18 and drain contact 20 shown in FIG. 2 may be formed by metal evaporation or metal sputtering. Then a passivation layer 24 may be deposited between the source 18 and the drain 20.

A gate region is then formed by etching through the passivation layer 24 in a gate area between the source 18 and drain 20 and into the AlGaN layer 16. In another embodiment the etch may extend through the AlGaN layer 16 and partially into the GaN layer 14 to an appropriate depth. A gate dielectric 26 is then deposited over the area between the source 18 and gate 22 and the gate 22 and the drain 20, and also deposited to line the etched trench that extends into the AlGaN layer 16. If the etched trench extends into the GaN layer 14, then the gate dielectric 26 also lines the etched trench that extends into the GaN layer 14.

After deposition of the gate dielectric 26, gate metal 22 is formed by evaporation or sputtering and fills the etched trench.

Various alternating passivation and metallization layers may be formed as a part of back-end processing to improve the parasitic resistance of the device and provide connection to device pads and/or a package.

The use of the mask layer 50 with tapered mask layer 60 or in another embodiment a mask with various size openings to control ion implantation and thereby the distribution of lattice damage in the drift region of the AlGaN layer 14 provides a significant improvement of the figure of merit (FOM) in type III Nitride HEMT devices by achieving flat electric field distribution in the drift region between the gate 22 and the drain 20. By controlling the ion implantation and thereby the lattice damage in the drift region from the gate to the drain, the 2DEG 42 is varied in the drift region to form a non-uniform lateral 2DEG distribution 44. As shown in the embodiment of FIG. 2, the 2DEG increases in the drift region in the direction from the gate 22 towards the drain 20. A flat electric field distribution results from the non-uniform lateral 2DEG distribution 44 along the drift region which provides the improvement in the figure of merit (FOM).

Implementing a non-uniform lateral 2DEG profile 44 along the drift region by causing tapered lattice damage to the carrier supplying layer, such as AlGaN layer 16, controls the level of damage or stress in that layer. The lateral control of the damage in the carrier supplying layer is achieved by means of ion implantation of a suitable ion specie through a masked layer, such as mask layer 50, that has a tapered profile, where the vertical height of the masking layer determines the stopping power of the implanted projectiles and hence their projected range. The tapered profile of the masking layer may be produced by gray scale photolithography followed by an etch step.

Alternatively the stress in the AlGaN layer 16 may be varied by opening windows in the photo resist with varying size where the size of the opening is a function of the lateral distance from the gate to the drain. The size of the openings may be larger or smaller in the drift region near the gate and decrease or increase, respectively, in the drift region in the direction of the drain.

Since the density of charge in the 2DEG region is determined locally by the magnitude of the damage induced by ion implantation, a non-uniform 2DEG distribution 44 is achieved by varying the lattice damage laterally over the drift region. If the lattice damage caused by ion implantation is reduced as a function of a distance from the gate region along the drift region by increasing the height of the mask layer 50 or by reducing the size of openings in the mask, the 2DEG 44 density increases as a function of distance from the gate region along the drift region, as shown in FIG. 2.

Figure 3A:
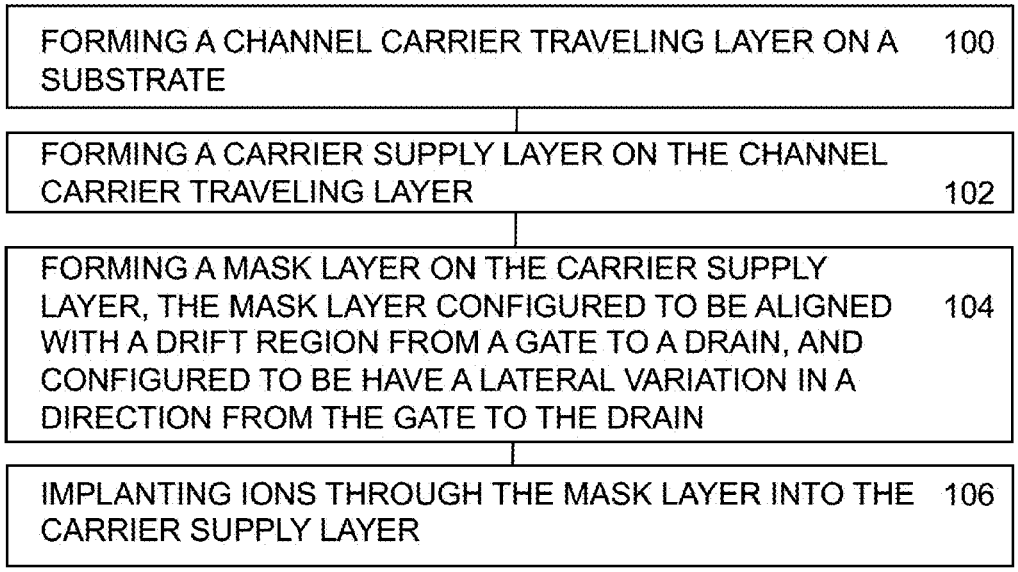

FIGS. 3A-3C are flow diagrams for methods of fabricating a HEMT a type III Nitride device in accordance with the present disclosure.

In step 100 a channel carrier traveling layer 14 is formed on a substrate 12. Then in step 102 a carrier supply layer 16 is formed on the channel carrier traveling layer 14. In an embodiment, the layers 14 and 16 are formed by an epi manufacturer.

Next in step 104 a mask layer 50 is formed on the carrier supply layer 16. The mask layer is configured to be aligned with a drift region from a gate to a drain, and configured to be have a lateral variation in a direction from the gate to the drain. Then ions 52 are implanted through the mask layer 50 into the carrier supply layer 16.

In one embodiment the mask layer is formed in step 108 by forming a tapered section on the mask layer that has a thickness that increases in the direction from the gate to the drain by using gray scale photolithography and then in step 110 etching the mask layer to form the tapered section.

In another embodiment the mask layer is formed by coating the carrier supply layer with photoresist in step 112 and then in step 114 opening windows in the photoresist of varying size such that the size of the openings decrease in the direction from the gate to the drain.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A high electron mobility field effect transistor (HEMT) comprising:
   lattice damage in a drift region of a carrier supply layer between a gate and a drain; wherein the lattice damage increases linearly along the drift region from near the drain to near the gate; and
   a two dimensional electron gas (2DEG) in the drift region between the gate and the drain that has a non-uniform lateral 2DEG distribution that increases in a direction in the drift region from the gate to the drain.

2. The HEMT of claim 1:
   wherein the lattice damage decreases linearly in a direction in the drift region from the gate to the drain.

3. The HEMT of claim 1 wherein a flat electric field along the drift region results from the 2DEG distribution.

4. The HEMT of claim 1 further comprising:
   a substrate;
   a channel carrier traveling layer on the substrate; and
   a carrier supply layer on the channel carrier traveling layer.

5. The HEMT of claim 4 wherein:
   the substrate comprises silicon (Si), sapphire, silicon carbide (SiC), OR bulk single crystal gallium nitride (GaN);
   the channel carrier traveling layer comprises a GaN layer; and
   the carrier supply layer comprises a AlGaN layer.

6. The HEMT of claim 5 further comprising:
   a passivation layer over the AlGaN layer; and
   wherein the gate comprises:
      gate metal extending through the passivation layer and into the AlGaN layer; and
      a gate dielectric layer surrounding the gate metal extending through the passivation layer and into the AlGaN layer.

7. The HEMT of claim 5 further comprising:
   a passivation layer over the AlGaN layer; and
   wherein the gate comprises:
      gate metal extending through the passivation layer and the AlGaN layer and into the GaN layer; and
      a gate dielectric layer surrounding the gate metal extending through the passivation layer and the AlGaN layer and into the GaN layer.

8. A field effect transistor (FET) comprising:
   lattice damage in a drift region of a carrier supply layer between a gate and a drain;
   wherein the lattice damage increases linearly along the drift region near the drain to near the gate.

9. The FET of claim 8 further comprising:
   a two dimensional electron gas (2DEG) in the drift region between the gate and the drain that has a non-uniform lateral 2DEG distribution that increases in a direction in the drift region from the gate to the drain.

10. The FET of claim 9 wherein a flat electric field along the drift region results from the 2DEG distribution.

11. The FET of claim 8 further comprising:
    a substrate;
    a channel carrier traveling layer on the substrate; and
    a carrier supply layer on the channel carrier traveling layer.

12. The FET of claim 11 wherein:
    the substrate comprises silicon (Si), sapphire, silicon carbide (SiC), or bulk single crystal gallium nitride (GaN);
    the channel carrier traveling layer comprises a GaN layer; and
    the carrier supply layer comprises a AlGaN layer.

13. The FET of claim 12 further comprising:
    a passivation layer over the AlGaN layer; and
    wherein the gate comprises:
       gate metal extending through the passivation layer and into the AlGaN layer; and
       a gate dielectric layer surrounding the gate metal extending through the passivation layer and into the AlGaN layer.

14. The FET of claim 12 further comprising:
    a passivation layer over the AlGaN layer; and
    wherein the gate comprises:
       gate metal extending through the passivation layer and the AlGaN layer and into the GaN layer; and
       a gate dielectric layer surrounding the gate metal extending through the passivation layer and the AlGaN layer and into the GaN layer.

* * * * *